United States Patent [19]

Davis et al.

[11] 4,304,536
[45] Dec. 8, 1981

[54] GREEN SHEET SUPPORT FIXTURE SPEED AND POSITION CONTROL SYSTEM FOR A SCREENING MACHINE

[75] Inventors: Gordon T. Davis, Pompano Beach; Wolfgang Mueller, Lighthouse Point, both of Fla.; Lawrence P. Remsen, Stanfordville, N.Y.; Alfred A. Stricker, Pompano Beach, Fla.

[73] Assignee: International Business Machines Corporation, Armonk, N.Y.

[21] Appl. No.: 194,727

[22] Filed: Oct. 7, 1980

[51] Int. Cl.³ .................... B29C 27/00; B29D 9/08
[52] U.S. Cl. .............................. 425/110; 425/811
[58] Field of Search ....................... 425/110, 811

[56] References Cited

U.S. PATENT DOCUMENTS 3,751,204  8/1973  Baker .............................. 425/811
4,068,994  1/1978  Cadwallader et al. .......... 425/110

Primary Examiner—J. Howard Flint, Jr.
Attorney, Agent, or Firm—Sughrue, Mion, Zinn, Macpeak and Seas

[57] ABSTRACT

A horizontally movable slide bears a two section, continuously extending horizontally inclined, steep and shallow sloped cam slot controlling the vertical rise and fall of a cam follower driven support fixture for supporting a ceramic green sheet in underlying contact with a stencil mask in an automatic MLC screening machine. An apertured positioning flag moves horizontally with the slide and past a vertical height digital position encoder assembly and a mask separate encoder assembly. The positioning encoder assembly provides an electrical signal for controlling an actuator mechanism causing slide movement, indicative of the desired final positioning height of the green sheet relative to the mask when the fixture is moving towards the mask. When the actuator mechanism drives the slide in the opposite direction, to lower the green sheet from the mask, the mask separate encoder assembly produces a signal, in response to common positioning flag movement in the opposite direction with the slide to effect a change in speed of the actuator mechanism. This provides slow initial separation of the green sheet from the mask and final removal of the fixture from screening height, at a much more rapid rate.

11 Claims, 5 Drawing Figures

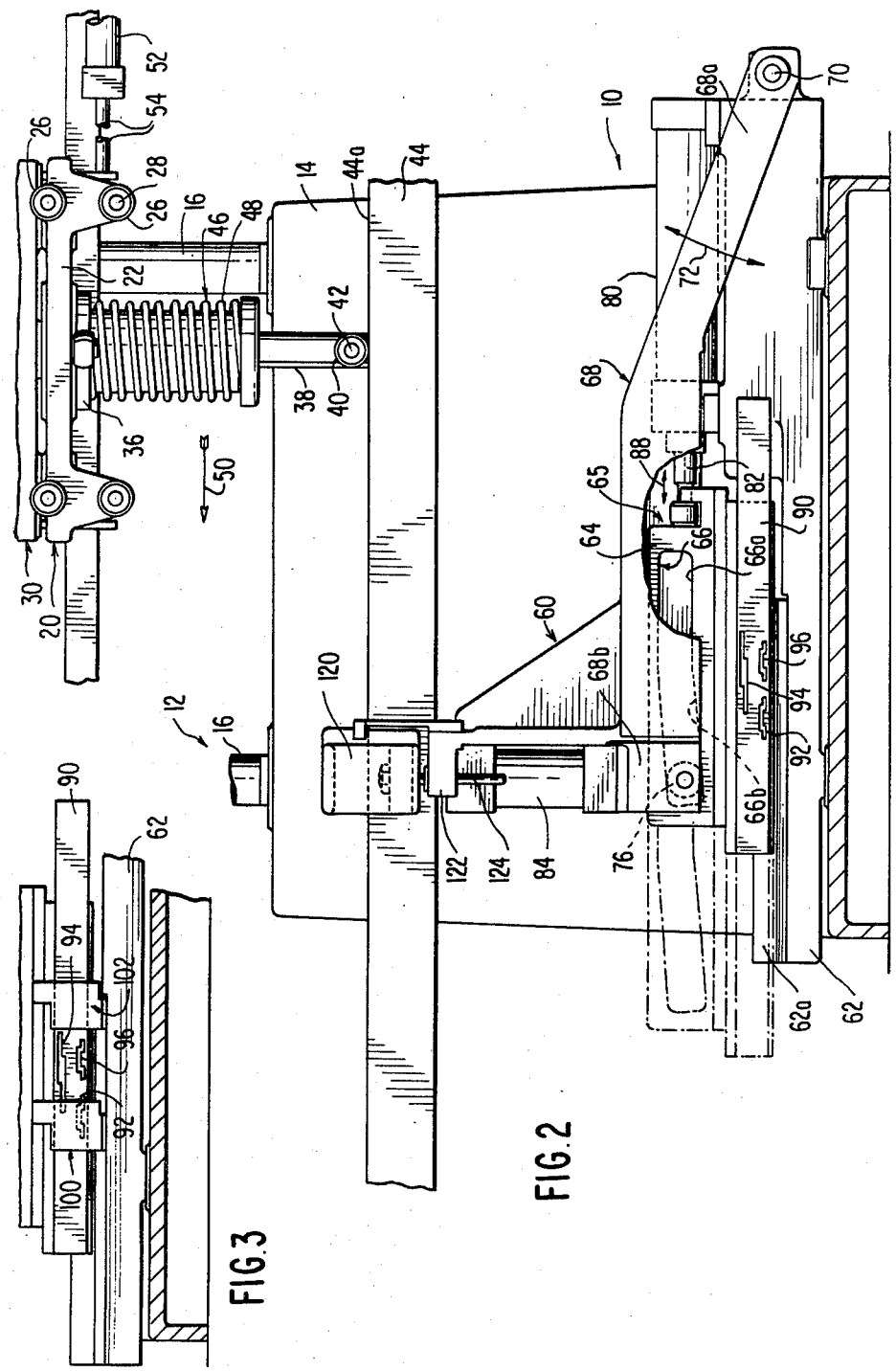

GREEN SHEET SUPPORT FIXTURE SPEED AND POSITION CONTROL SYSTEM FOR A SCREENING MACHINE

RELATED PATENTS AND APPLICATIONS

U.S. Pat. No. 4,068,994 issued Jan. 17, 1978, entitled "Apparatus for Printing of Ceramic Green Sheets" by R. H. Cadwalder et al, and assigned to International Business Machines Corporation.

U.S. patent application Ser. No. 194,724 filed Oct. 7, 1980 entitled "Automatic Multilayer Ceramic (MLC) Screening Machine" by Gordon T. Davis et al, and assigned to International Business Machines Corporation.

FIELD OF THE INVENTION

This invention relates to screening machines for paste screening of ceramic green sheets and more particularly to a screening machine which permits high repeatable, fast positioning of multilayer ceramic green sheets under a stencil mask at incrementally adjustable heights during the screening process, and an accelerated two step green sheet and mask separation, subsequent to screening.

DESCRIPTION OF THE PRIOR ART

Multilayer ceramic semiconductor packages have been formed by stacking flexible paperlike sheets commonly referred to as ceramic green sheets. Green sheet segments of desired size and configuration are punched to provide via holes. By a screen printing technique, a conductive paste fills the via holes and/or a conductive circuit pattern is applied to the face of the green sheets, as required. Such green sheets, after screening, are assembled in a stack, pressed and subsequently sintered in an oven at a relatively high temperature. Upon sintering, the vehicle and any binder material are burned off with the remaining rigid unitary ceramic body provided with interior interconnected conductive patterns. Additional processing occurs prior to the units being encapsulated.

Critical to the manufacturing process is the screening operation since the ceramic green sheets are relatively fragile, their thickness may be on the order of 0.008 inches, and their surface area is relatively large compared to their thickness.

In an attempt to automate the screen printing of ceramic green sheets, a screening machine was devised as set forth in the above identified U.S. Pat. No. 4,068,994 having a single combined load/unload station and a single horizontally displaced screening station. The load/unload station permits a green sheet to be manually loaded onto a transfer fixture at that station for subsequent movement to the screening station on the fixture or platform assembly. The fixture is both horizontally shifted from a load/unload station to a laterally displaced screening station and raised vertically thereof, to underlie and be centered with a stencil mask forming one component of the screening station. U.S. Pat. No. 4,068,994 employs an inclined plane or wedge arrangement for vertically moving the green sheet fixture into and out of engagement with the stencil mask. Both the lateral movement of the green sheet fixture and its vertical movement, once reaching the screening station, are effected at a single speed, thereby governing the overall time of the complete machine cycle. Further, the extent of vertical rise of the green sheet fixture and drop of the same at the screening station is fixedly determined by the angle of inclination of the inclined plane or wedge elements.

Therefore, it is primary object of this invention to provide an improved multilayer ceramic screening machine in which the cycle time of the screening machine is substantially reduced by providing a green sheet support fixture which is separated from the screener stencil mask at a slow initial speed but whose separation is accelerated, once initial spacing between the mask and green sheet has been accomplished.

It is further object of this invention to provide an improved multilayer ceramic screening machine in which the green sheet may be positioned relative to the underlying stencil mask for screening at the screening station at very precise, but readily adjustable positions.

It is a further object of this invention to provide an improved multilayer ceramic screening machine which employs a sophisticated optical sensing mechanism system for sensing movement of a movable drive mechanism operating to move the fixture into a precisely controlled vertical screening position and for subsequently, sensing incremental separation of the green sheet from the stencil mask at the screening position after screen printing of the green sheet, to facilitate two speed separation and reduction in machine cycle time.

It is a further object of the present invention to provide such an improved multilayer ceramic screening machine which utilizes a common optical flag and dual encoder assemblies to control both the vertical height of the green sheet fixture and the change in separation speed when returning the green sheet fixture to its lowered position, relative to the stencil mask.

It is a further object of the present invention to provide an improved multilayer ceramic screening machine in which separation of the green sheet from the overlying mask is controlled by sensing the position of the green sheet support fixture rather than the speed of movement of that fixture during lowering of that fixture and the green sheet from the overlying mask.

SUMMARY OF THE INVENTION

The automatic screening machine of the present invention includes a green sheet support fixture for supporting a ceramic green sheet underlying a stencil mask. The green sheet support fixture is movable vertically towards and away from the mask. A movable drive mechanism operatively couples the actuator mechanism to the green sheet support fixture. A position indicator mechanism coupled to the drive mechanism develops signals indicative of the position of the green sheet support fixture relative to the screening position. A control mechanism coupled to the actuator mechanism includes first means responsive to the position indicator signals, when the green sheet support fixture is moving away from the screening position, for causing the actuator mechanism to move the green sheet support fixture at a first, relatively slow initial speed as it first pulls away from the stencil mask and for causing the actuator mechanism to move the green sheet support fixture at a second and faster speed after the green sheet is separated from the mask a predetermined distance.

Further, the control mechanism additionally comprises second means responsive to the position indicator signals when the green sheet support fixture is moved towards the screening position for variably adjusting the vertical height of the green sheet support fixture at the screening position and immediately adjacent the stencil mask to compensate for green sheet thickness variation or the like.

Preferably, the movable drive mechanism comprises a horizontal shiftable slide with the slide including a horizontally oblique cam slot having integral, steep and shallow slope portions. The green sheet support fixture includes a cam roller follower positioned within the cam slot such that movement of the slide causes the green sheet support fixture to move relatively rapidly in a vertical direction when the cam follower is within the steep slope portion of the cam slot, but to move at an appreciably slower rate when the cam follower is within the shallow slope cam slot portion.

A bidirectional, coded position flag is operatively coupled to the drive mechanism and moves therewith. A fixture height position encoder assembly is fixedly mounted adjacent to the path of movement of the coded position flag for developing signals indicative of the position of the green sheet support fixture when the sheet support fixture is moving towards the screening position. A mask separate position encoder assembly is fixedly mounted adjacent the path of movement of the coded positioning flag and longitudinally spaced from the fixture height position encoder assembly. The mask separate position encoder assembly provides the position indicator signals as the green sheet is being separated from the stencil mask at the screening position. Preferably, the coded position flag comprises an opaque mask, digitally coded with four distinct tracks by having different shaped cut out windows providing a four bit digital code, defining fifteen different steps along the direction of movement of the slide assembly corresponding to an extent of movement of the cam follower within the steep and shallow slope portions of the cam slot. The encoder assemblies bear corresponding sets of four photocells aligned with the tracks of the digital code pattern portions of the position flag and alongside the path of movement of the position flag. Light means on the opposite side selectively illuminate the sets of photocells borne by the encoders. The control means further comprises push button operated switches constituting input means to a control processor, which input signals are compared to the signals emanating from the encoders. The actuator mechanism comprises a hydraulic cylinder operatively coupled to the slide, moving the slide bidirectionally, and solenoid valve means controlling the application of hydraulic fluid under pressure to the hydraulic cylinder. The control processor further comprises first and second compare logic elements for effecting such comparison between signals.

BRIEF DESCRIPTION OF THE DRAWINGS

FIG. 2 is a longitudinal, sectional view of a portion of the screening machine shown in FIG. 1, illustrating the speed and position control system employed at the screening station.

FIG. 3 is a vertical sectional view of a portion of the apparatus shown in FIG. 2 illustrating the code flag and the photoelectric encoders forming a part of the speed and position control system of FIGS. 1 and 2.

DESCRIPTION OF THE PREFERRED EMBODIMENT

Figure 1:
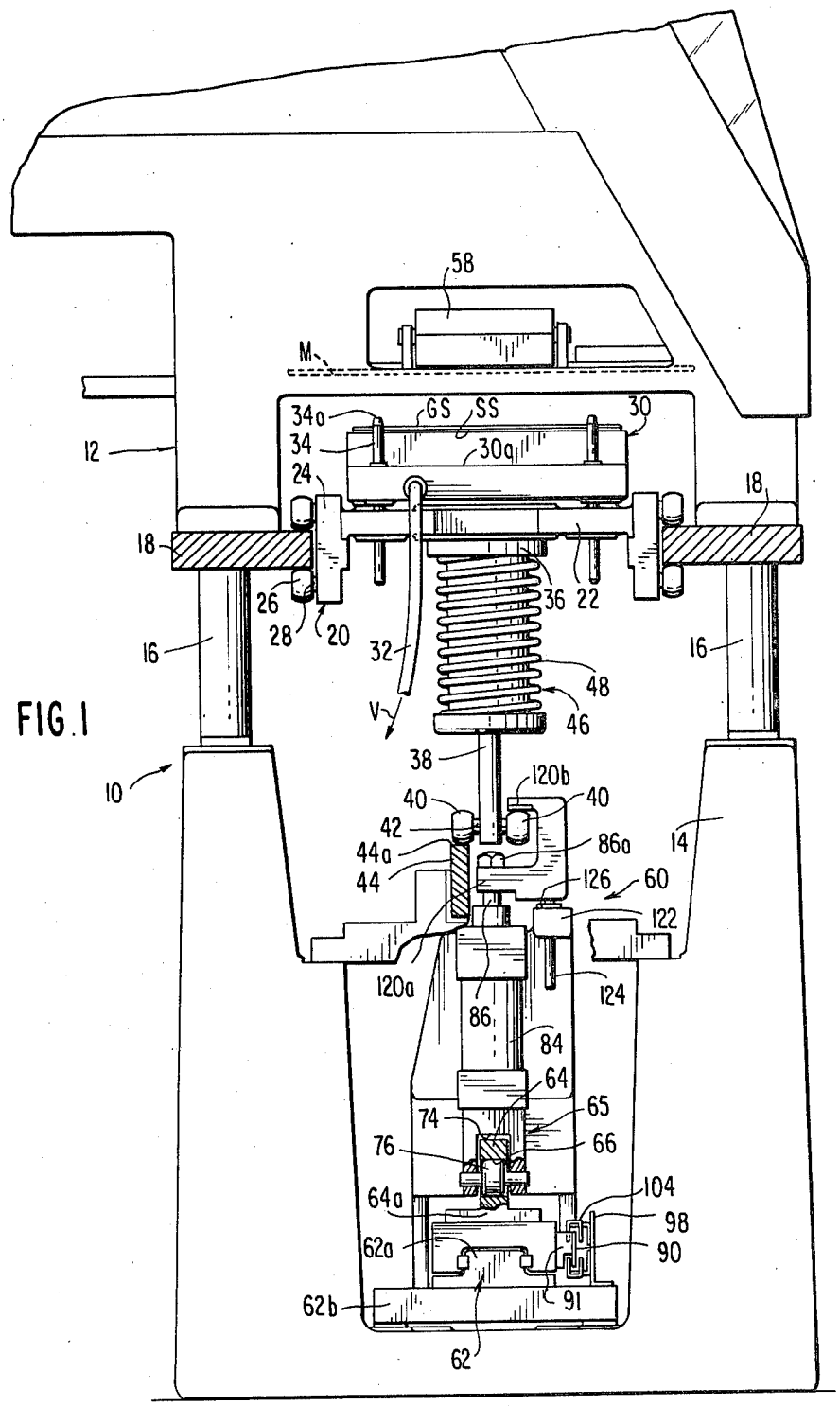
FIG. 1 is a vertical, sectional view of the improved multilayer ceramic (MLC) screening machine incorporating the green sheet support fixture speed and position control system of the present invention in a preferred form.

Referring to the drawings, there is shown in FIGS. 1, 2 and 3 the major components for controlling the speed and position of a green sheet support fixture at the screening station of an automatic multilayer ceramic screening machine and forming one embodiment of the present invention. The screening machine indicated generally at 10 is identical to that set forth in related U.S. application Ser. No. 194,724 entitled "Automatic Multilayer Ceramic (MLC) Screening Machine," referred to above, and reference may be had to that application for a complete understanding of the screening machine and the operation of the components at the screening station illustrated in FIGS. 1-3 inclusive. While the screening machine of the related application involves a plurality of longitudinally separate processing stations, with some of the stations duplicated, and wherein screening of individual work pieces, i.e., green ceramic sheets occurs at multiple screening stations, only one of the screening stations 12 is illustrated, and the invention is directed to a speed and position control system incorporated within the screening station 12. In the screening machine 10, in addition to the screening station 12, there is associated on respective sides of that screening station, a loading station and an unloading station with machine functions or operations occurring automatically. The machine operation sequence involves the movement or transfer of an unscreened green sheet from a loading station to screening station 12, where the green sheet is screened. Subsequently, it is moved from the screening station to the unloading station where, either manually or automatically, the screened green sheet is removed from the machine.

The screening machine may be of open frame construction including longitudinally spaced, generally U-shaped vertical walls 14, the walls including posts 16 upon which rests a pair of base rails or tracks 18 which extend longitudinally the length of the machine and along which are provided the various loading stations, screening stations and preferably a common unloading station at the center of the machine. Positioned on the base rails or tracks 18 is a longitudinally movable carriage indicated generally at 20 and comprised of a base member or chassis 22 which supports to opposite sides thereof side walls 24 which project above and below the base rails 18. To the outside of the side walls 24 are mounted for rotation, rollers 26 by way of pins 28. The rollers 26 rotate freely about their axes and are in contact with the top and bottom faces of the base rails 18, to opposite sides of the assembly. The carriage 20 is therefore movable along a horizontal path defined by the laterally opposed base rails 18. The carriage 20 is generally rectangular in plan configuration. The base or chassis 22 slidably mounts a vertically displaceable green sheet support fixture, indicated generally at 30, which is also of rectangular form and sized generally to that of the chassis 22. Further, the fixture 30 is sized to a green sheet GS and its underlying spacer sheet SS which are held on the upper surface 30a of fixture 30, preferably by vacuum pressure. The surface 30a is at least, partially porous, and open to an internal vacuum pressure supplied to the fixture 30 via a supply tube or line 32, as indicated by the arrow V. The green sheet GS and space sheet SS are provided with alignment holes, through which penetrate alignment pins 34 which project upwardly from face 30a of the fixture 30. The alignment pins are bullet-nosed as at 34a, facilitating the projection of the pins through the alignment holes of the green sheet GS and spacer sheet SS, as they are floated onto fixture 30 at a loading station (not shown) remote from screening station 12, prior to transport to that screening station.

The carriage 20 is provided with a bushing 36 within the center of chassis 22 through which slidably projects a fixture post 38. The fixture post 38 supports at its lower end a pair of cam follower rollers 40, on opposite post sides and being mounted for rotation about their axes on pin or axle 42 which extends at right angles to the axis of post 38. One of the cam follower rollers 40 normally rides on upper edge 44a of a cam rail 44 which extends longitudinally the full extent of the machine and parallel with and underlying the tracks or base rails 18. Interposed between the fixture post 38 and fixture 30 is a shock absorbing mechanism indicated generally at 46, the shock absorbing mechanism including at least one compression spring 48 which normally insures that the fixture 30 is in face abutting contact with the carriage chassis 22 upon which it is mounted and with a cam follower roller 40 in contact with the cam rail 44.

By reference to FIG. 2, it may be seen that the carriage 30 traverses longitudinally along a path defined by base rails 18. As indicated by arrow 50, the carriage 20 is being driven from right to left, that is, from a loading station to the right of the screening station 12 to a position within the screening station 12 by means of a complex hydraulic cylinder 52, upon application of hydraulic fluid to that cylinder. In that respect, a cylinder rod 54, which projects from one end of the cylinder 52, is connected at its opposite end to a drive plate 56 which depends from carriage 20. Thus, by extension of cylinder rod 54, the carriage is shifted longitudinally along the base rail 18, bearing with it the vertically shiftable green sheet support fixture 30. During this travel, the cam follower roller 40 rolls on the upper edge 44a of cam rail 44. Travel is terminated at the point where the carriage 20 and the fixture 30, and particularly the green sheet GS, underlies and is in alignment with a mask indicated generally at M, FIG. 1, within the screening station 12. Mask M is clamped at a fixed position within this screening station, overlying the green sheet GS by mask clamps 58.

The present invention is particularly directed to a fixture height adjustment and fixture speed control system or mechanism, indicated generally at 60, which is borne by the screening machine frame at the screening station 12 and which in part functions to adjustably position green sheet GS and its support fixture 30 relative to the fixed height mask M, within the screening station 12. The mechanism 60 comprises, within the longitudinally spaced vertical walls 14, a longitudinally extending base or block 62, including a rail portion 62a at the center thereof. The base 62 is generally of inverted T-shaped configuration. Slidably mounted on the base 62, is an elongated slide assembly 65. Slide assembly 65 comprises a slide 64 including a slide base portion 64a of U-shaped configuration, longitudinally slidably mounted on rail portion 62a, by way of roller bearings 66. Slide 64 includes a central, vertical cam member 64b, within which is formed, an elongated, generally horizontally inclined, cam slot indicated generally at 66, including a slow rise or shallow cam slot portion 66a and a more steeply inclined cam slot portion 66b. The cam slot portions are extensions of each other. Pivotably mounted to base 62 is a cam follower pivot arm, indicated generally at 68. Cam follower arm is pivoted, at one end 68a, to base 62 by means of a horizontal pivot pin 70, such that the cam follower may rotate about the axis of pin 70 through a short arc as indicated by the double headed arrow 72, FIG. 2. Cam follower arm 68 bears at its opposite end 68b, an elongated central grove 74, within which is rotatably mounted a cam follower roller 76, by way of axle 78. The cam follower roller 76 rotates about its axis and has a diameter slightly less than the width of cam slot 66 and is positioned within cam slot 66. As may be appreciated, by movement of slide 64 horizontally on rail 62a, the cam follower is forced to move vertically, to follow the inclined configuration of the cam slot 66.

Fixedly mounted to base 62, at one end of that member, is a Z-height hydraulic drive cylinder 80, from one end of which projects a cylinder rod 82, which is coupled directly to the slide 64. Slide 64 shifts horizontally to the extent of extension and retraction of cylinder rod 82.

Fixedly mounted to the top of the top of the cam follower arm 68 and in line with the cam follower roller 76 is an initial height control hydraulic cylinder 84, bearing a cylinder rod 86 which projects from its upper end. Cylinder rod 86 terminating in a headed end portion 86a. The headed end 86a of the cylinder rod 86 is adapted to contact the bottom of fixture post 38 so as to drive post 38 vertically upwardly against compression spring 48 and forcing the carriage 30 to move upwardly towards mask M, when the post 38 is aligned with the cylinder rod 86.

This movement is controlled preferably by an automated program afforded to the screening machine 10 and is effected by the supply of hydraulic fluid to a piston (not shown) internally of the hydraulic cylinder 84 and fixed to the cylinder rod, and to the side of that piston opposite end 86a of the rod 86 abutting the bottom of post 38. Further, as may be appreciated, additional vertical movement is superimposed upon rod 86 by pivoting of the cam follower pivot arm 68 about its pivot axis 70 in response to lateral shifting of slide 64, by energization of hydraulic motor 80. Preferably, the movement of post 38 and fixture 30, by operation of initial height control hydraulic cylinder 84, is effected prior to any additional rise given to the fixture 30 by way of the cam slot and follower action of cam slot 66 and cam follower roller 76. By the application of a pressurized hydraulic fluid to cylinder 80, cylinder rod 70 is shifted to the left, which movement is indicated by the double headed arrow 88, FIG. 2, such that fixture 30 is further lifted towards the mask holder clamp assembly 59 holding mask M. The extent of such vertical movement is controlled by the configuration of the cam slot portions 66a and 66b and therefore the extent of horizontal movement of slide 64. Initially, the cam follower roller 76 rolls up the steep portion 66b of this cam slot and subsequently terminates its movement (under a preferential program) within the shallow rise portion 66a of the cam slot 66.

FIGS. 1, 2 and 3 further illustrate a mechanical mechanism for insuring that, subsequent to screening of the green sheets, the fixture 30 is moved down such that the cam follower roller 40 is in face abutting contact with the upper edge 44a of the cam rail 44. This is achieved by use of a C-shaped pull block 120 which is mounted for vertical movement on a transverse support bar 122 by way of an integral rod 124. Rod 124 projects from base 120a of the C-shaped block 120 and is slidably received within bar 122, by a busing 126. Further, the C-shaped block 120 bears, on a lower arm 120a, the headed end 86a of cylinder rod 86 such that, during retraction of the cylinder rod 86, the headed end 86a forces the C block downwardly. Block 120 also includes uper arm 120b, which contacts the periphery of cam follower roller 40, to the side of the post 38 opposite roller 40 contacting cam rail 44, to insure that, as the cylinder rod 86 drives the C block downwardly, it will pull down post 38 and fixture 30 fixed to the post 38. This, of course, does not affect the further lowering of the post 38 by way of the cam follower 76 riding within cam slot 66 of slide 64.

Figure 4:
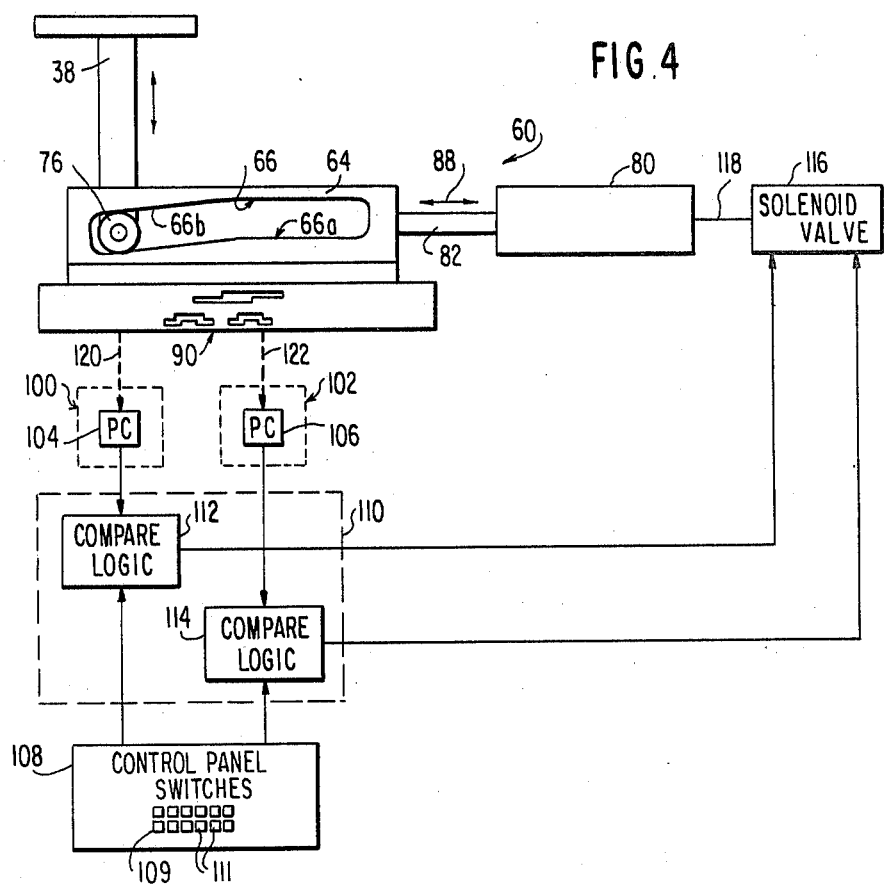
FIG. 4 is a schematic diagram of the green sheet support fixture speed and position control system of the present invention.
Figure 5:
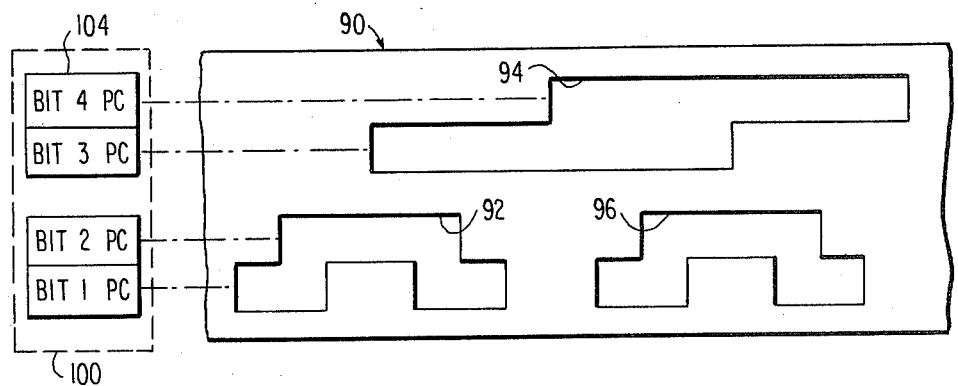
FIG. 5 is a plan view of the coded portion of the positioning flag employed in the green sheet support fixture speed and position control system.

The extent of closely controlled positioning of the green sheet GS with respect to the mask M as well as the change from slow separation speed of the green sheet GS from the mask, after screening operation, to a fast or high speed drop out of the fixture from its near proximity to the mask M is effected by plural optical encoder assemblies associated with a common coded positioning flag forming components of mechanism 60 and further illustrated in detail in FIGS. 3, 4 and 5. As may be appreciated by reference to FIG. 2, the the green sheet position and separation speed control system indicated generally at 60 involves the utilization of a common coded positioning flag indicated generally at 90, FIG. 2. Flag 90 is fixedly mounted to slide 64 by way of a bracket 91, FIG. 1. The positioning flag 90 is comprised of an opaque metal strip or the like bearing cut outs or windows.

Reference to FIG. 5 illustrates the positioning flag, which constitutes a digitally coded light mask having four distinct tracks with different shaped cut out windows or slots being formed at the slots 92, 94 and 96. The slots 92 and 96 are at the same vertical height, in line with each other, and of identical configuration. Slot 94 is differently configured, completely overlies slot 96 and partially overlies slot 92. Each of the code slots include integral portions of two bit heights. The slots or windows provide a four-bit digital code defining 15 different longitudinal positions or steps in the direction of movement of the slide 64 and the positioning flag, which extends longitudinally parallel thereto and is fixed to the slide for movement therewith.

As further seen in FIG. 3, an enlarged foot 62b of the base 62 fixedly supports, by way of a vertical mounting plate 98, a Z-height digital position encoder assembly indicated generally at 100 and a mask separate encoder assembly indicated generally at 102. Encoder assembly 100 is in juxtaposition to the horizontally movable positioning flag 90 and longitudinally spaced from the second, fixedly held, mask separate encoder assembly 102. Each of the encoder assemblies includes laterally opposed sets of four, non-movable photocells such as those indicated generally at 104, FIG. 4, for encoder assembly 100. The mask separate encoder assembly 102 is provided with a second set of four non-movable photocells 106. The photocells are positioned, as evidenced schematically in FIG. 5, at vertical heights corresponding to the four tracks borne by the positioning flag along which the cut out windows 92, 94 and 96 are formed to form the flag code as indicated in the plan view of FIG. 5.

As may be appreciated by further reference to FIG. 4, the first set of four non-movable photocells 104 is used to detect the light patterns coming through the position flag slots or windows 92, 94 and 96 when the green sheet GS borne by fixture 30 is near by at the screening position, at the end of its upward movement, that is, in juxtaposition to the overlying mask M. The signals emanating from photocells 104 provide for the Z-height position control such that the signals act to stop the upward movement of the fixture 30 when it reaches a preselected, Z-height position. By further reference to FIG. 4, the system is shown to include a control panel indicated generally at 108 provided with push button matrix 109 bearing push button operated switches 111 or other manual switch input means connected to a series/one control processor indicated in dotted line fashion, FIG. 4, at 110. Processor 110 includes two compare logic elements as at 112 and 114, respectively, for the Z-height position control aspect of the system 60, involving encoder assembly 100 and the mask separate position control aspect involving encoder assembly 102. FIG. 4 also shows schematically, slide 64, the dual section cam slot 66 involving steep slope portion 66b and the slightly inclined or shallow cam slot portion 66a, cam follower roller 76 and schematically, post 38 and fixture 30, as well as the positioning flag 90.

Additionally, in FIG. 4 the slide 64 is shown as drivable by hydraulic cylinder 80, via cylinder rod 82. Slide movement, as indicated by double headed arrow 88 in two directions, is provided by controlled application of hydraulic fluid under pressure to the hydraulic cylinder 80. The schematic representation, FIG. 4, involves the utilization of an electric solenoid valve indicated schematically by block 116 which is connected to the hydraulic cylinder via connection 118 to control the hydraulic fluid supply to the piston (not shown) born by cylinder rod 82 within hydraulic cylinder 80. Electrically, control signals set up within the system and effected through control panel 108 via a push button matrix 109 act either separately, or in conjunction with program derived signals, to implement the series/one control processor 110. In the simplified form shown in FIG. 4, control signals via control panel 103 are provided to the processor 110 for comparison by way of compare logic elements 112 and 114 with signals emanating from the Z-height position and mask separate encoder assemblies 100 and 102. The compare logic element 112 receives signals directly from the photocells 104 of the Z-height digital position encoder assembly 100, and logic element 114 receives signals from photocells 106 of mask separate encoder assembly 102. The optical passage of light to the photocells of the encoder assemblies 100, 102, is indicated in dotted line fashion at 120 and 122, respectively. The light passes through the code slots of the common positioning flag 90 during traverse of slide 64 bearing cam slot 66 and the positioning flag 90. The positioning flag 90 is positioned longitudinally on the slide 60, correlated to the position of the cam slot 66, to effect the desired control of both initial height positioning of the green sheet fixture 30 and the green sheet GS carried thereon, as well as for feeding to the control processor a signal indicative of initial slow separation position of the green sheet from the mask to the point where accelerated dropping of the green sheet fixture may be accomplished by increasing the speed of operation of hydraulic cylinder 80, via solenoid valve 116. By spacing the encoder assemblies, when the photocells 104 of encoder assembly 100 are illuminated via the code slots, photocells 106 of encoder assembly 102 are cut off, and vice versa.

Controlled operation of the system is achieved in a manner which may be readily appreciated from the prior description. Briefly, during traverse of the slide 64 from right to left, the cam follower 76 rolling within the cam slot 66 shifts from an initial position within the steeply inclined slot portion 66b into the shallow inclined portion 66a of the cam slot. The first set of photocells 104 detect the light pattern passing through the position flag slots or windows 92, 94 and 96 during this movement, when the green sheet fixture is near screening position, at the end of the upward movement of the green sheet fixture 30. The compare logic element 112 causes, when the signal from the control panel 108 compares favorably with the Z-height position signal sent from encoder assembly 100, to feed to solenoid valve 16 an appropriate electrical signal terminating the supply of hydraulic fluid to hydraulic cylinder 80, thereby locking the slide 64 in a position with the green sheet support fixure 30 positioned at proper height within the screening station to present the green sheet GS to mask M.

Subsequent to the screening operation, the green sheet GS must be moved downwardly, that is, away from the mask M prior to the carriage 20 and the fixture 30 moving the screened green sheet from the screening station 12 to an unloading station (not shown), along base rails 20. Initially, under program control, the hydraulic cylinder is supplied hydraulic fluid at a rate that causes slow movement of the slide 64 from left to right. With the cam follower roller 76 within the shallow sloping portion 66a of the cam, initial separation of the green sheet from the mask is very slow. As a matter of fact, preferably, there is only a 0.009 inch rise for cam slot portion 66a. This not only achieves a high degree of positioning accuracy due to this approximately 1000 to one ratio between the vertical movement of the green sheet fixture and the horizontal movement of the slide assembly, but this assures a very slow separation between the green sheet and the fixture, preventing damage to the flexible and fragile thin ceramic green sheet GS borne thereby. During slide return movement of slide 64, from left to right, the set of photocell detectors 106 for the mask separate encoder 102 provides control signals upon detection of light patterns coming through the position flag slots 92, 94 and 96. At the time in the machine cycle where the green sheet GS has separated sufficiently from the stencil mask M, by a comparison of encoder assembly 102 signal to control panel 108 setup, compare logic element 114 feeds a control signal to the solenoid valve 117 causing the hydraulic cylinder 80 to receive hydraulic fluid at an increased rate to rapidly drive the slide 64 to the right, to thereby cause the remainder of the downward movement of the green sheet fixture 30 to be achieved at a much more rapid speed.

Thus, the present invention provides a high degree of positioning accuracy because of the 1000 to one ratio between the vertical movement of the green sheet fixture and the horizontal movement of the slide assembly, the slide assembly moving 1000 times faster than the green sheet fixture. The overall cycle time is reduced because of the fast downward movement of the fixture 30, once the green sheet GS has initially separated from the mask. Selection and adjustment of the Z-height and mask separate positions are easily accomplished by means of control panel push button switches 111. As stated previously, alternately, the positions can be selected by the software in the series/one control processor 110 which bears compare logic elements 112 and 114.

The present invention insures improved positioning accuracy, more reliable pulling away of the green sheets from the stencil mask, and shorter cycle time for the green sheet screening operation. This increases the production rate and increases the yield of satisfactorily screened green sheets.

Further, in comparing the simplified schematic diagram of FIG. 4 to the mechanical elements within the green sheet fixture height and positioning control 60 of Fixtures 1, 2 and 3, it may be appreciated that, in addition to the vertical height of the fixture 30 being determined by the extent of horizontal movement of slide 64, there is an additional vertical lift provided by the stroke of hydraulic cylinder 84.

While the invention has been particularly shown and described with reference to a preferred embodiment thereto, it will be understood by those skilled in the art that various changes in form and details may be made therein without departing from the spirit and scope of the invention.

What is claimed is:

1. In a screening machine for screening conductive material through a stencil mask and onto an underlying ceramic green sheet, said machine including a green sheet support fixture for supporting said ceramic green sheet for movement vertically toward and away from said stencil mask, an actuator mechanism for causing mechanical movement, a movable drive mechanism operatively coupling said actuator mechanism to said green sheet support fixture for moving the green sheet support fixture into and out of screening position immediately underlying said stencil mask, the improvement comprising:
   a position indicator mechanism coupled to said drive mechanism for developing signals indicative of the position of the green sheet support fixture relative to said screening position; and
   a control mechanism coupled to said actuator mechanism and including first means responsive to position indicator signals when the green sheet support fixture is moving away from the screening position for causing the actuator mechanism to move the green sheet support fixture at a first initial speed as it first pulls away from the stencil mask, and for causing the actuator mechanism to move the green sheet support fixture at a second and faster speed after it reaches a predetermined separation distance from said stencil mask.

2. The automatic screening machine as claimed in claim 1, wherein said control mechanism further comprises second means responsive to position indicator signals, when said green sheet support fixture is moving towards the screening position, for varying the vertical height of the green sheet support fixture at said screening position immediately adjacent the stencil mask, to compensate for green sheet thickness variation or the like.

3. The automatic screening machine as claimed in claim 1, wherein said movable drive mechanism comprises a horizontally shiftable slide, said slide including a horizontally oblique cam slot, said cam slot including integral steep and shallow slope portions, said green sheet support fixture being mounted for vertical movement overlying said horizontally movable slide, and a cam follower roller borne by said green sheet support fixture and positioned within said cam slot, such that horizontal movement of said slide causes said green sheet support fixture to move vertically relatively rapidly when said cam follower is within said steep slope portion of said cam slot and to move at an appreciably slower rate when said cam follower is within said shallow slope cam slot portion.

4. The automatic screening machine as claimed in claim 2, wherein said movable drive mechanism comprises a horizontally shiftable slide, said slide including a horizontally oblique cam slot, said cam slot including integral steep and shallow slope portions, said green sheet support fixture being mounted for vertical movement overlying said horizontally movable slide, and a cam follower roller borne by said green sheet support fixture and positioned within said cam slot, such that horizontal movement of said slide causes said green sheet support fixture to move vertically relatively rapidly when said cam follower is within said steep slope portion of said cam slot and to move at an appreciably slower rate when said cam follower is within said shallow slope cam slot portion.

5. The automatic screening machine as claimed in claim 3, wherein said shallow slope cam slot portion has an approximately 1000 to 1 ratio of horizontal slide movement to cam slot rise; whereby, during movement of said slide in a horizontal direction to effect green sheet fixture movement towards screening position, termination of vertical rise of the green sheet support fixture occurs with the cam follower within the shallow slope cam slot portion for extremely precise positioning of said green sheet relative to said overlying stencil mask, while during opposite horizontal movement of said slide to effect green sheet separation from said stencil mask subsequent to screening, an initial slow separation speed is initially effected to prevent damage to the relatively fragile ceramic green sheet subsequent to screening.

6. The automatic screening machine as claimed in claim 4, wherein said shallow slope cam slot portion has an approximately 1000 to 1 ratio of horizontal slide movement to cam slot rise; whereby, during movement of said slide in a horizontal direction to effect green sheet fixture to movement towards screening position, termination of vertical rise of the green sheet support fixture occurs with the cam follower within the shallow slope cam slot portion for extremely precise positioning of said green sheet relative to said overlying stencil mask, while during opposite horizontal movement of said slide to effect green sheet separation from said stencil mask subsequent to screening, an initial slow separation speed is initially effected to prevent damage to the relatively fragile ceramic green sheet subsequent to screening.

7. The automatic screening machine as claimed in claim 1, wherein said position indicator mechanism comprises a common, bidirectional coded position flag operatively coupled to said drive mechanism for movement therewith, a fixture height position encoder assembly is fixedly mounted adjacent the path of movement of said coded position flag for developing said signals indicative of the position of the green sheet support fixture when said positioning flag is moving in a first direction with said sheet support fixture moving toward screening position, and a mask separate position encoder assembly is fixedly mounted adjacent the path of movement of said positioning flag and longitudinally spaced from said fixture height position encoder assembly, said mask separate position encoder assembly providing said position indicator signals as said green sheet is being separated from said stencil mask at said screening position, and wherein said control mechanism comprises a control processor, input means to said processor for providing input signals representative of desired fixture height position at said screening station and a desired mask separate position for initiating the change of speed from slow separation of the green sheet from the mask to an accelerated separation, and means for comparing said control input signals to said position encoder assembly signals for operation of said actuator mechanism.

8. The automatic screening machine as claimed in claim 6, wherein said position indicator mechanism comprises a common, bidirectional coded position flag operatively coupled to said drive mechanism for movement therewith, a fixture height position encoder assembly is fixedly mounted adjacent the path of movement of said coded position flag for developing said signals indicative of the position of the green sheet support fixture when said positioning flag is moving in a first direction with said sheet support fixture moving toward screening position, and a mask separate position coder assembly is fixedly mounted adjacent the path of movement of said positioning flag and longitudinally spaced from said fixture height position encoder assembly, said mask separate position encoder assembly providing said position indicator signals as said green sheet is being separated from said stencil mask at said screening position, and wherein said control mechanism comprises a control processor, input means to said processor for providing input signals representative of desired fixture height position at said screening station and a desired mask separate position for initiating the change of speed from slow separation of the green sheet from the mask to an accelerated separation, and means for comparing said control input signals to said position encoder assembly signals for operation of said actuator mechanism.

9. The automatic screening machine as claimed in claim 7, wherein said coded position flag comprises an opaque mask including digitally coded light transmitting pattern means borne by said coded position flag and said encoder assembly bear sets of non-movable photocells aligned with respective digital code pattern portions of said position flag, on one side of the path of movement of said position flag and light means on the opposite side of said position flag for selective illumination of said sets of photocells borne by said encoder assemblies and wherein said encoder assemblies are positioned relative to said position flag such that when the photocells of said fixture height position encoder assembly detect light patterns through the position flag digitally coded light transmitting pattern means, said set of photocells for said mask separate encoder assembly is cut off from such light patterns, and vice versa.

10. The automatic screening machine as claimed in claim 9, wherein said coded positioning flag comprises a digitally coded light mask having four distinct tracks with multiple, cut out windows providing a four bit digital code defining fifteen different steps along the direction of movement of the slide assembly corresponding to movement of the cam follower within the steep and shallow slope portions of said cam slot and wherein each of said encoders comprise sets of four-nonmovable vertically aligned photocells at positions corresponding to the four tracks of the digitally coded light mask.

11. The automatic screening machine as claimed in claim 10, wherein said control means comprises a control panel including push button operated switch means constituting said input means to said control processor, said actuator mechanism comprises a hydraulic cylinder operatively coupled to said slide for moving said slide bidirectionally and a solenoid valve controlling the application of hydraulic fluid under pressure to said hydraulic cylinder for effecting operation of said hydraulic cylinder, and wherein said control processor comprises first and second logic elements operatively connected to said control panel push button operated switch means and said fixture height position and said mask separate position encoder assemblies and means for operatively connecting said compare logic elements to said solenoid valve for selective control of said solenoid valve operation depending upon whether said fixture height position encoder assembly or said mask separate position encoder assembly is detecting light patterns eminating from the position flag cut out windows.

* * * * *

UNITED STATES PATENT AND TRADEMARK OFFICE
CERTIFICATE OF CORRECTION

PATENT NO. : 4,304,536
DATED : Dec. 8, 1981
INVENTOR(S) : Gordon T. Davis et al

It is certified that error appears in the above—identified patent and that said Letters Patent is hereby corrected as shown below:

Column 2, line 4, after "is" insert --- a ---

Column 2, line 12, after "is" insert --- a ---

Column 5, line 4, change "space" to --- spacer ---

Column 6, line 13, correct the spelling of "groove"

Column 7, line 7, change [busing] to --- bushing ---

Column 7, line 12, correct the spelling of "upper"

Column 7, line 29, delete [the] (last occurrence)

Column 8, line 38, correct the spelling of "borne"

Column 14, line 12, correct the spelling of "emanating"

Signed and Sealed this

Sixth Day of April 1982

[SEAL]

Attest:

GERALD J. MOSSINGHOFF

Attesting Officer    Commissioner of Patents and Trademarks